(12) United States Patent
Bonam et al.

(10) Patent No.: US 10,725,454 B2
(45) Date of Patent: Jul. 28, 2020

(54) MASK PROCESS AWARE CALIBRATION USING MASK PATTERN FIDELITY INSPECTIONS

(71) Applicant: International Business Machines Corporation, Armonk, NY (US)

(72) Inventors: Ravi K. Bonam, Albany, NY (US); Nicole Saulnier, Slingerlands, NY (US); Michael Crouse, Slingerlands, NY (US); Derren N. Dunn, Sandy Hook, CT (US)

(73) Assignee: International Business Machines Corporation, Armonk, NY (US)

( * ) Notice: Subject to any disclaimer, the term of this patent is extended or adjusted under 35 U.S.C. 154(b) by 72 days.

(21) Appl. No.: 16/186,980

(22) Filed: Nov. 12, 2018

(65) Prior Publication Data

US 2020/0150629 A1    May 14, 2020

(51) Int. Cl.
*G05B 19/41* (2006.01)
*G05B 19/4155* (2006.01)

(52) U.S. Cl.
CPC ........... *G05B 19/4155* (2013.01); *G05B 2219/45027* (2013.01); *G05B 2219/45028* (2013.01)

(58) Field of Classification Search
None
See application file for complete search history.

(56) References Cited

U.S. PATENT DOCUMENTS

| 5,862,058 | A  | 1/1999 | Samuels et al. |
| 6,541,167 | B2 | 4/2003 | Petersen et al. |
| 6,544,699 | B1 | 4/2003 | Kim et al. |
| 7,729,529 | B2 | 6/2010 | Wu et al. |
| 7,966,579 | B2 | 6/2011 | Herold |
| 9,002,497 | B2 | 4/2015 | Volk et al. |
| 9,305,346 | B2 | 4/2016 | Yu et al. |
| 2003/0003385 | A1 | 1/2003 | Martin |
| 2014/0123084 | A1 | 5/2014 | Tang et al. |
| 2014/0186750 | A1* | 7/2014 | Lu ............ G03F 1/74 430/5 |

(Continued)

OTHER PUBLICATIONS

T. Liang et al., "EUV Mask Infrastructure Readiness and Gaps for TD and HVM," Proceedings of SPIE, Nov. 11, 2015, 14 pages, vol. 9635.

(Continued)

*Primary Examiner* — Paul B Yanchus, III (74) *Attorney, Agent, or Firm* — Vazken Alexanian; Ryan, Mason & Lewis, LLP (57) ABSTRACT

Techniques for modifying a mask fabrication process based the identification of an abnormality in a pattern of a fabricated lithography mask are disclosed including comparing a fabricated lithography mask to a lithography mask design where the fabricated lithography mask is fabricated based at least in part on the lithography mask design using a mask fabrication process. An abnormality in a pattern of the fabricated lithography mask relative to a corresponding one of the plurality of patterns in the lithography mask design is identified based at least in part on the comparison of the fabricated lithography mask to the lithography mask design. A calibrated mask model is generated based at least in part on the identified abnormality in the pattern of the fabricated lithography mask and the mask fabrication process is modified based at least in part on the calibrated mask model.

20 Claims, 10 Drawing Sheets

(56) References Cited

U.S. PATENT DOCUMENTS

| | | |
|---|---|---|
| 2018/0060702 A1 | 3/2018 | Ma et al. |
| 2019/0094680 A1* | 3/2019 | Huang ................ H01L 21/0277 |
| 2019/0204235 A1* | 7/2019 | Nishizawa ......... G01N 21/8806 |

* cited by examiner

PIXEL'S GRAY LEVELS *WITHIN* RANGE 20 TO 120

PIXEL'S GRAY LEVELS *GREATER* THAN 120 OR LESS THAN 20

PIXEL'S OUTSIDE OF GDS

MASK PROCESS AWARE CALIBRATION USING MASK PATTERN FIDELITY INSPECTIONS

FIELD

The present application generally relates to semiconductor fabrication techniques and, more particularly, to the fabrication of lithographic masks for use in lithographic patterning.

BACKGROUND

Lithography patterning processes are often applied to a semiconductor wafer in conjunction with the manufacture of integrated circuits to transfer a pattern to the semiconductor wafer. The fabrication of a lithographic mask for use in lithography patterning typically requires a multi-step fabrication process. For example, a design for the lithographic mask may be generated and the lithographic mask may be fabricated based on the design using a fabrication process including resolution enhancement techniques (RETs), resist model calibration, and optical-proximity correction (OPC). Once fabricated, the lithographic mask may be used for lithography patterning to transfer the pattern to the semiconductor wafer.

SUMMARY

In one embodiment, techniques for modifying a mask fabrication process based the identification of an abnormality in a pattern of a fabricated lithography mask are provided. An exemplary computer-implemented method comprises comparing a fabricated lithography mask to a lithography mask design where the fabricated lithography mask is fabricated based at least in part on the lithography mask design using a mask fabrication process. An abnormality in a pattern of the fabricated lithography mask relative to a corresponding one of the plurality of patterns in the lithography mask design is identified based at least in part on the comparison of the fabricated lithography mask to the lithography mask design. A calibrated mask model is generated based at least in part on the identified abnormality in the pattern of the fabricated lithography mask and the mask fabrication process is modified based at least in part on the calibrated mask model.

These and other objects, features and advantages of the present invention will become apparent from the following detailed description of illustrative embodiments thereof, which is to be read in connection with the accompanying drawings.

DETAILED DESCRIPTION

Fabricating a lithographic mask for use in lithographic patterning typically requires a multi-step fabrication process. For example, a mask design may be passed through a series of steps including, e.g., RET, a resist model, and OPC prior to the fabrication of the lithographic mask. Once the lithographic mask has been fabricated, the pattern of the lithographic mask may be transferred to an underlying semiconductor wafer, for example, using a desired lithography method.

Some or all of the steps in the process of fabricating the lithographic mask may be modified to change the resulting lithographic mask. Typically, the process of modifying the lithographic mask involves first patterning the mask onto an underlying semiconductor wafer, analyzing the patterned semiconductor wafer to identify abnormalities or other defects in the transferred patterns that require changes to the fabrication process, and determining what modifications to make to the fabrication process. Some example modifications that may be made to the fabrication process of a lithography mask may include, for example, modifications to the lithography mask design itself, modifications to the RET, modifications to the resist model, modifications to the OPC, or any other modifications to the fabrication process. However, such a process of patterning the resulting mask onto a semiconductor wafer for each iteration to determine whether any abnormalities or defects are present in the transferred pattern that may necessitate a change to the fabrication process requires substantial effort, time, and materials.

The techniques for modifying a lithography mask fabrication process based on an identification of an abnormality in a pattern on a fabricated lithography mask are disclosed that do not require the transfer of the pattern from the fabricated lithography mask to the underlying semiconductor wafer. These techniques provide a more efficient process for modifying the fabrication process of a lithography mask to correct for abnormalities or other deficiencies in the patterns that are found on the fabricated lithography mask itself.

Figure 1:
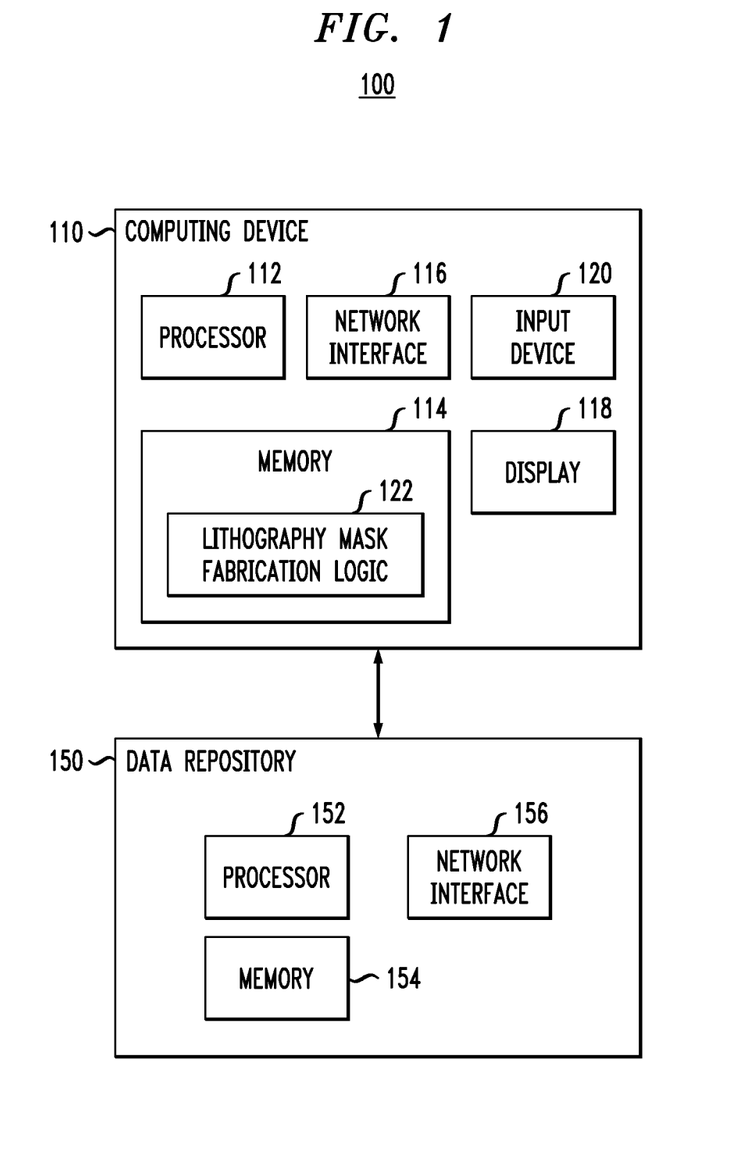
FIG. 1 is a diagram illustrating system architecture, according to an exemplary embodiment of the present disclosure.

With reference now to FIG. 1, an embodiment of a system architecture 100 for modifying a lithography mask fabrication process is illustrated. In some embodiments, system 100 includes a computing device 110, and a data repository 150.

Computing device 110 includes at least one processor 112, memory 114, at least one network interface 116, a display 118, an input device 120, and may include any other features commonly found in a computing device. In some embodiments, computing device 110 may include, for example, a personal computer, workstation, laptop, tablet, smart device, smart phone, smart watch, or any other similar computing device that may be used by a user.

Processor 112 may include, for example, a central processing unit (CPU), a microcontroller, Field Programmable Gate Array (FPGAs), or any other form of processing circuitry that is configured to perform various operations. Processor 112 may be configured to execute instructions as described below. These instructions may be stored, for example, in memory 114. As used herein, the term "processor" may include a single core processor, a multi-core processor, multiple processors located in a single device, or multiple processors in wired or wireless communication with each other and distributed over a network of devices, the Internet, or the cloud. Accordingly, as used herein, functions, features or instructions performed or configured to be performed by a "processor", may include the performance of the functions, features or instructions by a single core processor, may include performance of the functions, features or instructions collectively or collaboratively by multiple cores of a multi-core processor, or may include performance of the functions, features or instructions collectively or collaboratively by multiple processors, where each processor or core is not required to perform every function, feature or instruction individually.

Memory 114 may include, for example, computer readable media or computer readable storage media in the form of volatile memory, such as random-access memory (RAM) and/or cache memory or others. Memory 114 may include, for example, other removable/non-removable, volatile/non-volatile storage media. By way of non-limiting examples only, memory 114 may include a portable computer diskette, a hard disk, a random-access memory (RAM), a read-only memory (ROM), an erasable programmable read-only memory (EPROM or Flash memory), a portable compact disc read-only memory (CD-ROM), an optical storage device, a magnetic storage device, or any suitable combination of the foregoing.

In some embodiments, computer software including instructions or code for performing the methodologies of the invention, as described herein, may be stored in associated memory 114 and, when ready to be utilized, loaded in part or in whole (for example, into RAM) and implemented by processor 112. Such software could include, but is not limited to, firmware, resident software, microcode, and the like. The memory 114 may include local memory employed during actual implementation of the program code, bulk storage, and cache memories which provide temporary storage of at least some program code in order to reduce the number of times code must be retrieved from bulk storage during implementation.

In some embodiments, computing device 110 may include lithography mask fabrication logic 122, e.g., computer software instructions or code, stored in memory 114 that is configured to perform a lithography mask fabrication process and to modify the lithography mask fabrication processes based on identified abnormalities in patters of the resulting fabricated lithography mask as will be described in more detail below.

Network interface 116 is configured to transmit and receive data or information to and from a data repository 150 or any other server, component, or computing device via wired or wireless connections. For example, network interface 116 may utilize wireless technologies and communication protocols such as Bluetooth®, WIFI (e.g., 802.11a/b/g/n), cellular networks (e.g., CDMA, GSM, M2M, and 3G/4G/4G LTE), near-field communications systems, satellite communications, via a local area network (LAN), via a wide area network (WAN), or any other form of communication that allows computing device 110 to transmit or receive information to or from data repository 150 including components of data repository 150.

Display 118 may include any display device that is configured to display information to a user of computing device 110. For example, in some embodiments, display 118 may include a computer monitor, television, smart television, or other similar displays. In some embodiments, display 118 may be integrated into or associated with computing device 110, for example, as a display of a laptop, smart phone, smart watch, or other smart wearable devices, as a virtual reality headset associated with computing device 110, or any other mechanism for displaying information to a user. In some embodiments, display 118 may include, for example, a liquid crystal display (LCD), an e-paper/e-ink display, an organic LED (OLED) display, or other similar display technologies. In some embodiments, display 118 may be touch-sensitive and may also function as an input device 120.

Input device 120 may include, for example, a keyboard, a mouse, a touch-sensitive display 118, a keypad, a microphone, or other similar input devices or any other input devices that may be used alone or together to provide a user with the capability to interact with computing device 110.

Data repository 150 may include, for example, a processor 152, memory 154, and a network interface 156 that may include similar functionality as processor 112, memory 114, and network interface 116. In some embodiments, data repository 150 may, for example, be any computing device, server, database or similar system, or any combination thereof, that is configured to interact with or provide data to computing device 110. In some embodiments, for example, data repository 150 may include a distributed storage system including a plurality of servers, databases, or other components. In some embodiments, the data stored in data repository 150 may alternatively be stored in memory 114 of computing device 110 for use by computing device 110 such that no connection to a data repository 150 may be necessary to obtain the data. In some embodiments, for example, data repository may store a catalogue of lithography mask designs and other data associated with the catalogue of lithography mask designs including, for example, parameters or other settings for each step in the lithography mask fabrication process.

Figure 2:
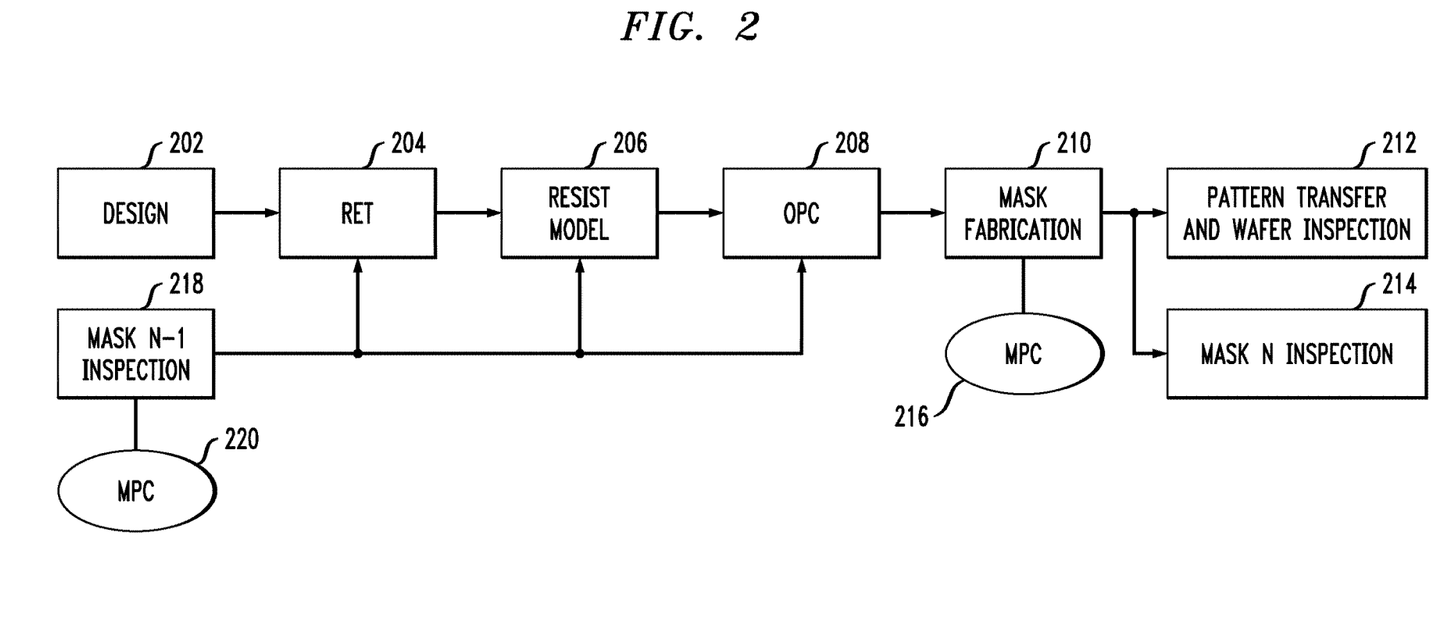
FIG. 2 is a flow diagram illustrating techniques according to an embodiment of the present disclosure.

FIG. 2 is a flow diagram illustrating a method implemented by lithography mask fabrication logic 122 according to an illustrative embodiment.

Figure 3:
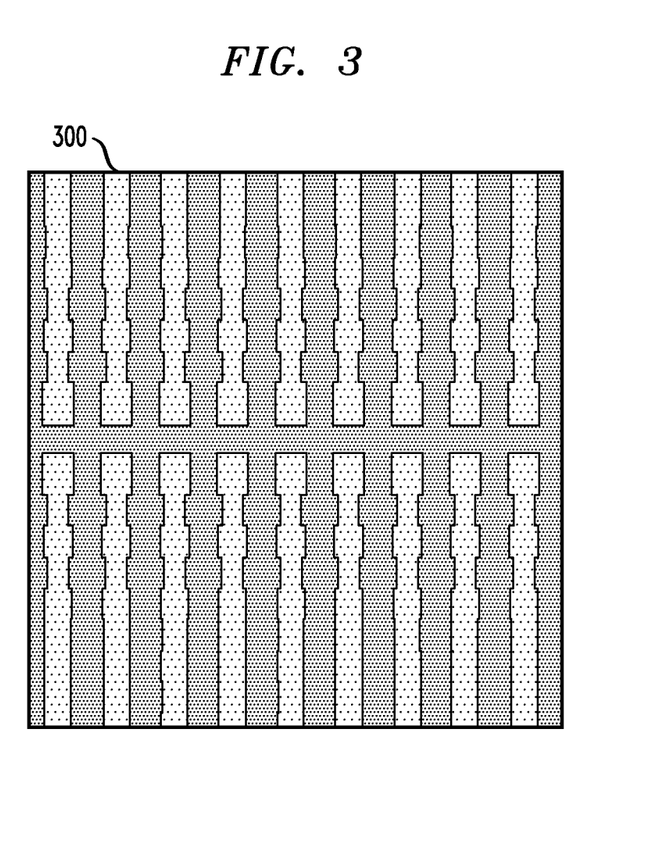
FIG. 3 illustrates an example lithography mask design according to an embodiment of the present disclosure.

At 202, lithography mask fabrication logic 122 obtains a lithography mask design, for example, from data repository 150. As an illustrative example, an obtained lithography mask may include one or more patterns such as, e.g., a pattern 300 as illustrated in FIG. 3.

At 204, lithography mask fabrication logic 122 performs one or more resolution enhancement techniques (RETs) on the obtained lithography mask design. The RETs may, for example, be modified based on any mask process limitations identified by pattern fidelity inspections and thereby adjustments are made to the illumination and output a co-optimized lithography solution.

At 206, lithography mask fabrication logic 122 applies one or more resist models to the modified lithography mask design output at 204. For example, the resist models may be further adjusted as part of the co-optimization based on mask pattern fidelity and modified lithography mask design output at step 204.

At 208, lithography mask fabrication logic 122 performs optical-proximity correction (OPC) on the modified lithography mask design output at 206. For example, the optical-proximity correction may further adjust the modified lithography mask design output at 206 by making calculated changes to certain feature types and their edges to account for any discrepancies identified by the mask pattern fidelity inspections and output a further modified lithography mask design.

Figure 4A:
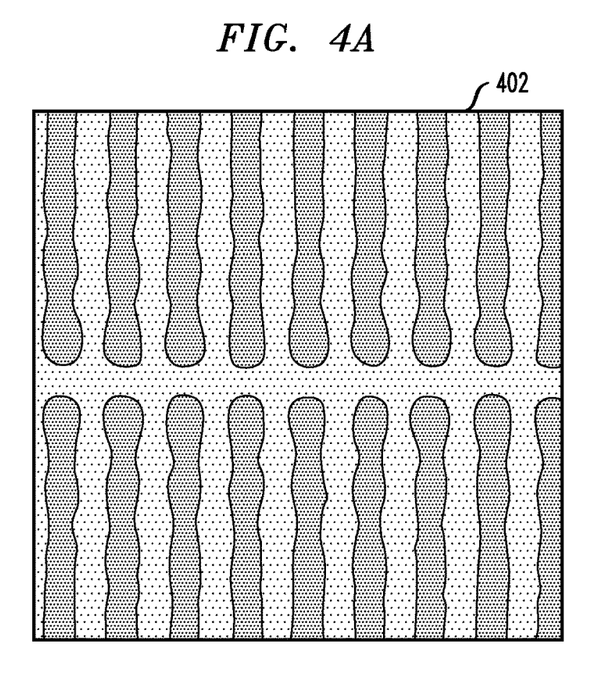
FIG. 4A illustrates an example lithography mask fabricated based on the lithography mask design of FIG. 3 according to an embodiment of the present disclosure.
Figure 4B:
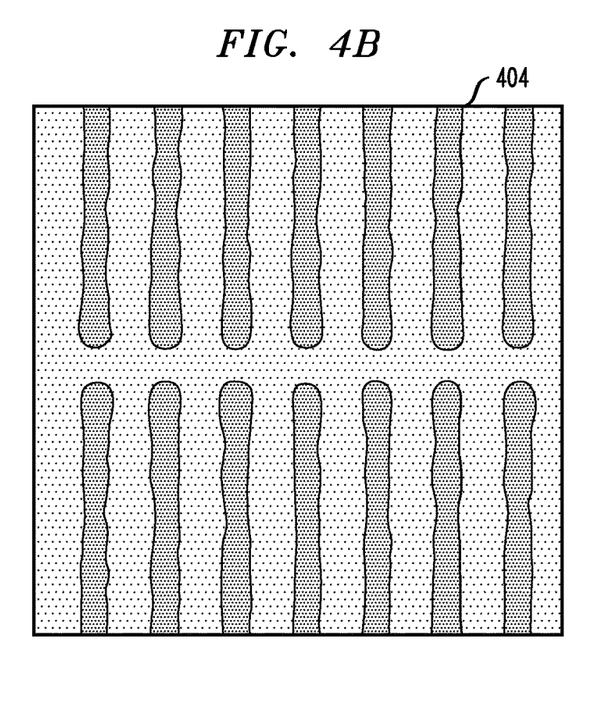
FIG. 4B illustrates another example lithography mask fabricated based on the lithography mask design of FIG. 3 using different fabrication process parameters according to an embodiment of the present disclosure.

At 210, a lithography mask is fabricated based on the modified lithography mask design output at 208. In an illustrative embodiment, a fabricated lithography mask may include one or more patterns that correspond to the patterns of the lithography mask design. FIGS. 4A and 4B illustrate example patterns 402 and 404 each of which is fabricated based on pattern 300 but using different parameters for the fabrication process. As seen in FIGS. 4A and 4B, for example, pattern 402 appears to be a much better match to pattern 300 than pattern 404 because the walls include some level of depth corresponding to the channels or grooves illustrated in pattern 300 while pattern 404 appears to have walls which are more linear and lack the channel or grooved features of pattern 300.

At 212, in some embodiments, the fabricated lithography mask may be used to transfer a pattern to a semiconductor wafer, e.g., using a patterning process, and the wafer may be inspected by optical, e-beam, or other techniques to identify any abnormalities or defects in the transferred pattern.

At 214, a mask N inspection may be performed on the fabricated mask after the pattern has been transferred to the wafer, for example, based on the identified abnormalities or defects found during the inspection of the wafer at 212. For example, the mask N inspection may identify the features of the fabricated mask that contributed the abnormalities or defects identified during the wafer inspection.

At 216, mask process corrections (MPCs) may be performed to correct the fabrication of the mask. In some embodiments, MPCs may be performed in conjunction with the fabrication of the mask at 210. During MPCs, the mask process may be characterized using a test mask having generic patterns that are not necessarily related to any particular design. The characterization information from the test mask may be applied to various mask designs irrespective of whether the mask designs are of the same type as the mask design from step 202 and may makes some generic corrections to the mask designs.

In some illustrative embodiments, the lithography mask fabricated at 210 may be inspected prior to transfer of the pattern to the wafer, e.g. a mask N-1 inspection, to determine whether there are any abnormalities in the lithography mask itself at 218. For example, the fabricated lithography mask may be compared to the lithography mask design obtained at 202 to determine whether there are any abnormalities in the patterns of the fabricated mask relative to corresponding patterns in the lithography mask design. In some embodiments, MPCs may also be performed at 220 in conjunction with the mask N-1 inspection of step 218.

Figure 5A:
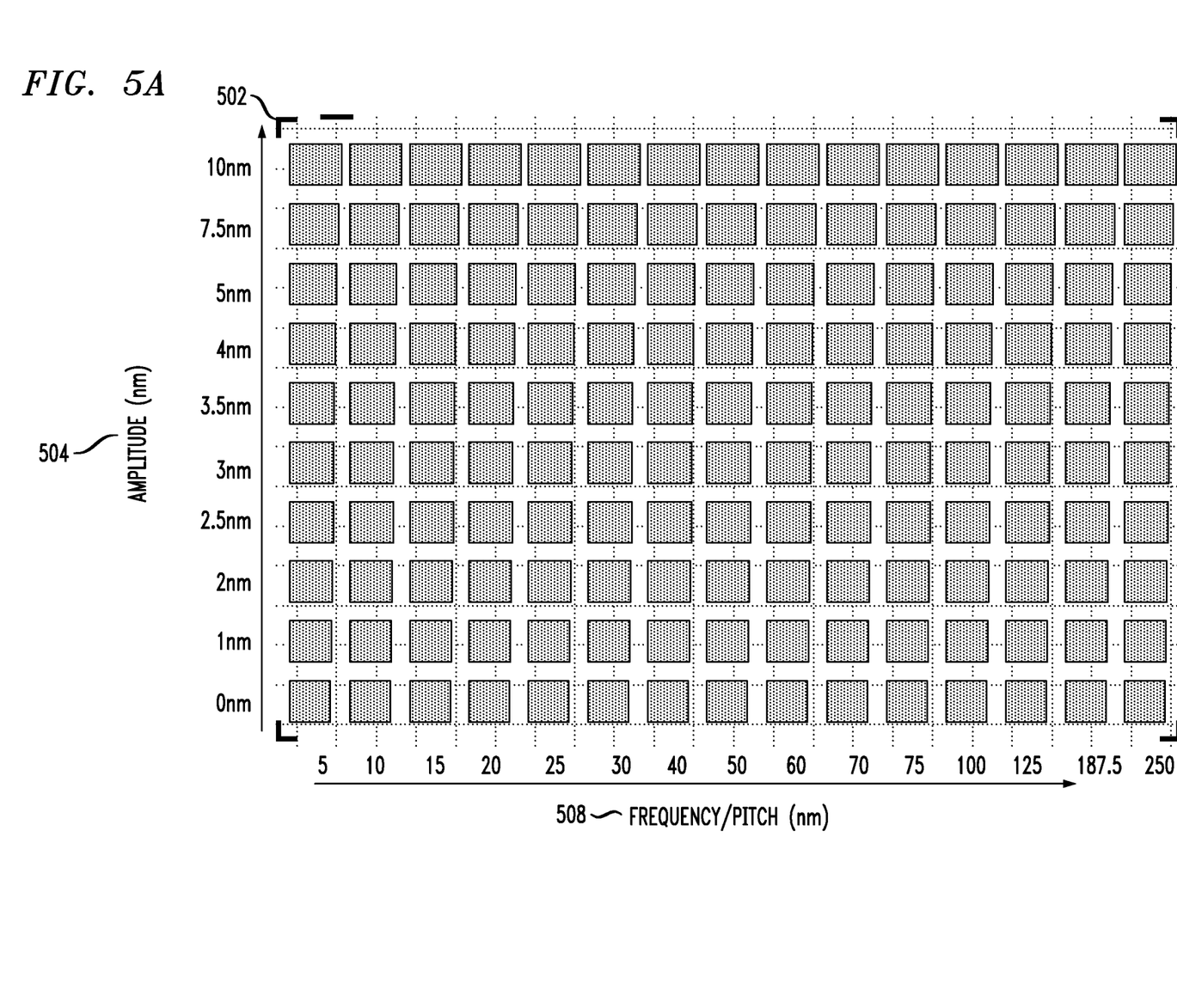
FIG. 5A illustrates an example of a block of a macro-level variability matrix according to an embodiment of the present disclosure.
Figure 5B:
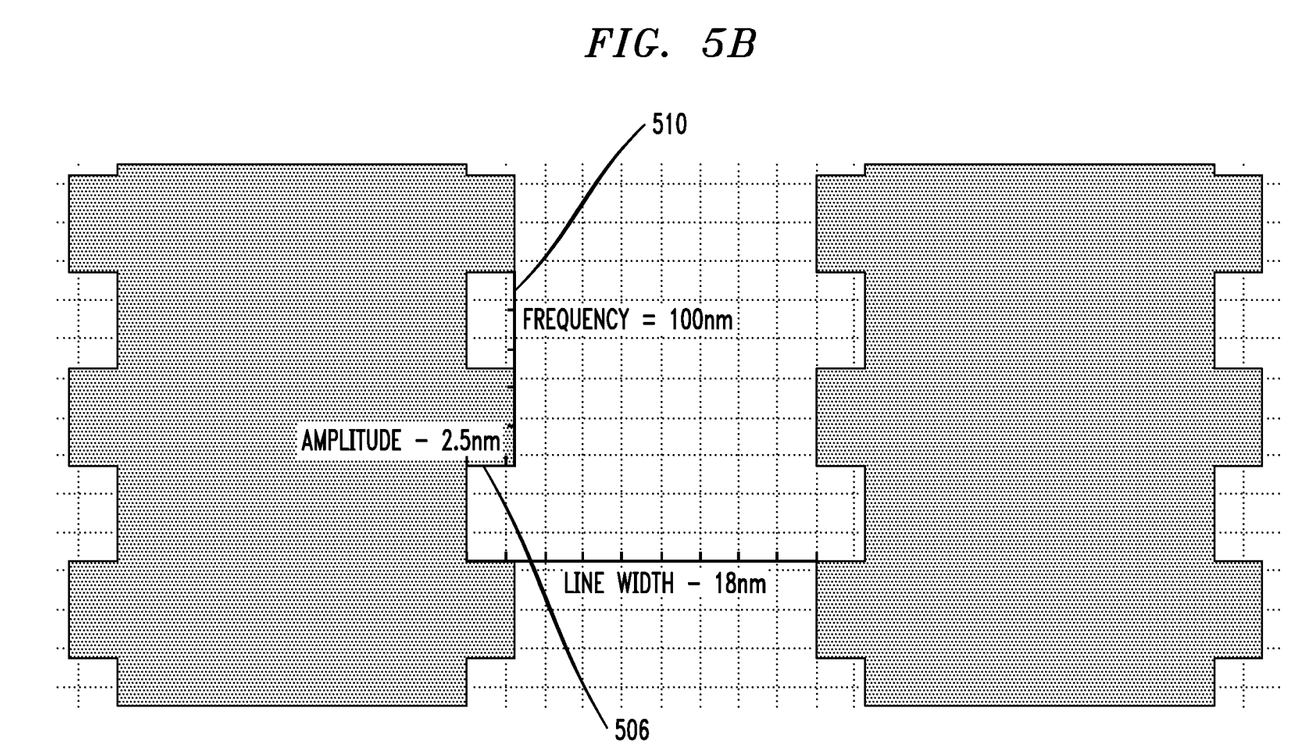
FIG. 5B is a diagram illustrating a portion of a line of a mask pattern according to an embodiment of the present disclosure.

In some embodiments, the mask N-1 inspection may be performed using an electron beam inspection tool that is configured to analyze the fabricated lithography mask relative to the obtained lithography mask design. The electron beam inspection tool is configured to generate a macro-level variability matrix comprising a plurality of blocks, where each block in the matrix contains one roughness type with amplitudes varying along height (Y) and frequency along Width (X). An example of a block 502 of the matrix is illustrated in FIG. 5A. With reference also to FIG. 5B, the pattern in some embodiments may be symmetric, asymmetric, a combination of symmetric and asymmetric, or any other pattern. The structures may, for example, have 18 nm, 20 nm, 22 nm, 24 nm, or any other half pitch.

The block 502 includes a roughness amplitude 504 of the pattern, as denoted, for example, by the Y axis in FIG. 5A. As shown in FIG. 5B, the amplitude defines the jog width 506 where, for example, the scale of 0-10 nm in FIG. 5A represents jog width along width of the line.

The block 502 also includes a roughness frequency 508 of the pattern, as denoted, for example, by the X axis in FIG. 5A. As shown in FIG. 5B, the frequency defines the jog periodicity 510 along the line length where, for example, the scale of 0-250 nm in FIG. 5A represents the jog periodicity.

Figure 6:
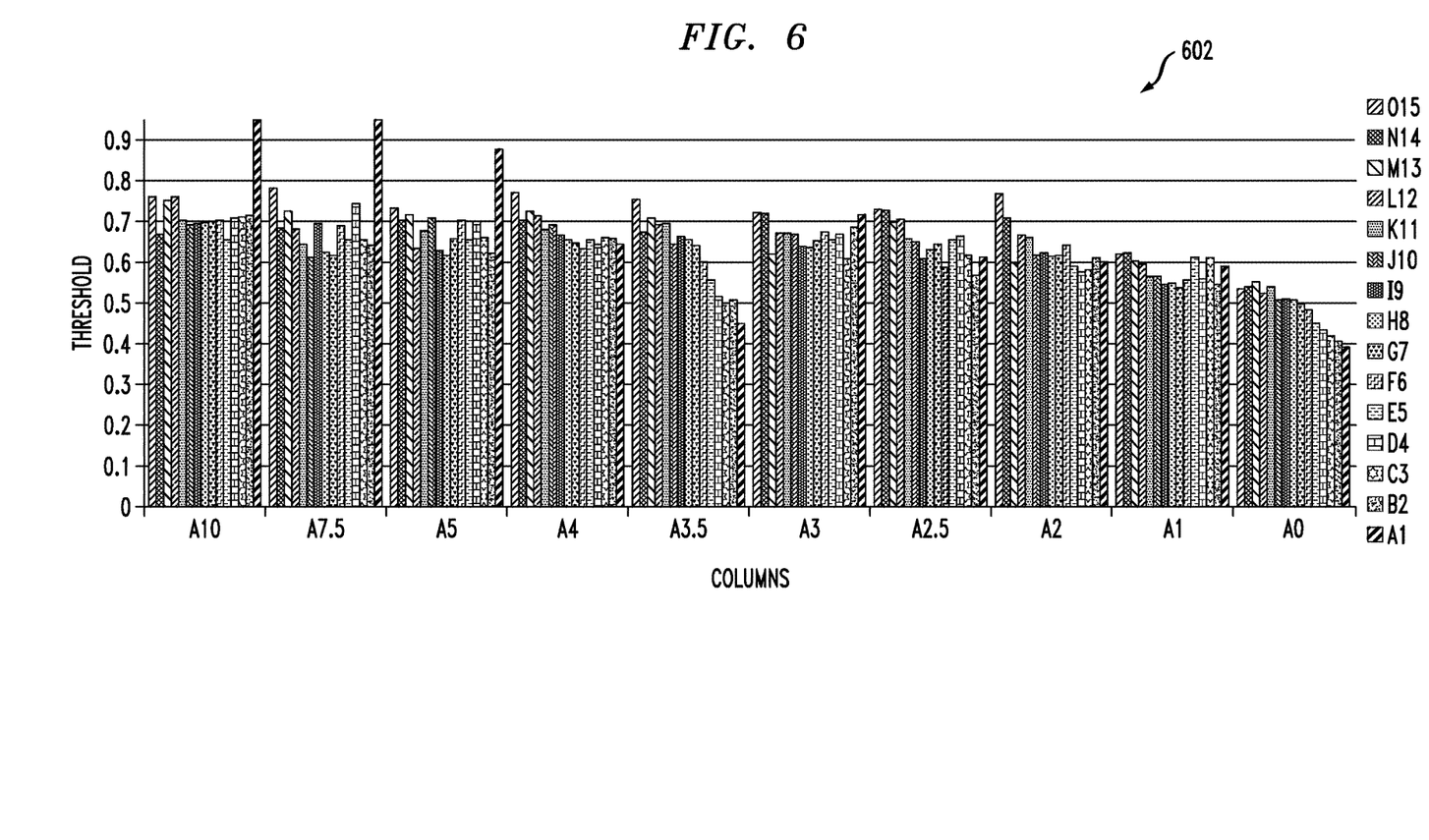
FIG. 6 illustrates an example output of an electron beam inspection tool according to an embodiment of the present disclosure.

With reference now to FIG. 6, the blocks in the matrix may be sorted and analyzed according to their respective threshold values for each jog amplitude. For example, as seen in FIG. 6, an illustration of the threshold value vs. design jog amplitude is shown where, for example, A0-A10 represents the jog amplitude as defined by the lithography mask design, each bar, A1, B2, . . . O15, represents a respective frequency between jogs, and the height of each bar, i.e., the threshold value, represents how close the jogs at that respective frequency are to the indicated jog amplitude as defined by the lithography mask design. The closer to zero a respective bar is, the better the match of the corresponding pattern to the pattern in the lithography mask design. In some embodiments, the bars may be sorted based on threshold value such that, for example, the tallest bar is on the left.

Those bars that have the highest threshold values, or threshold values above a particular value such as, e.g., 0.6, may be selected for use in generating the calibrated mask model. For example, a contour-based model calibration flow may be used on the selected mask patterns to generate the calibrated mask model. In this process, contours are extracted from the mask pattern images and optical simulations are performed to assess any wafer discrepancies using aerial image intensity evaluations. Contours can also be used to quantify pattern fidelity by comparing directly to post-OPC design structures.

In some embodiments, lithography mask fabrication logic 122 may feed the calibrated mask model output by the mask N-1 inspection back into one or more of the fabrication steps including, for example, the RET, the resist model, and the OPC steps to modify the fabrication process. For example, the calibrated mask model may include on or more corrections that modify one or more of the steps of the fabrication process.

Figure 7:
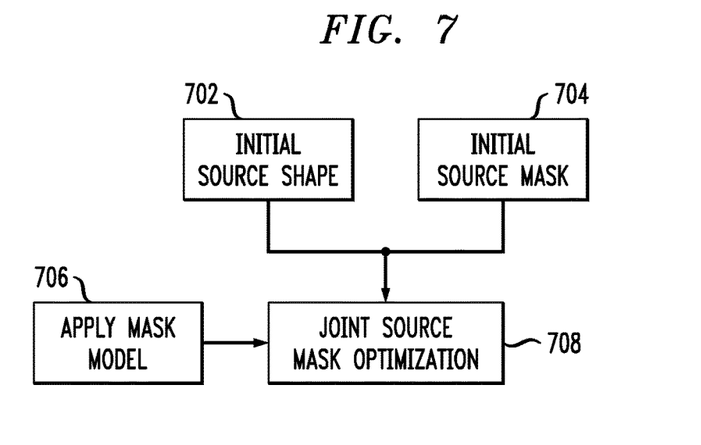
FIG. 7 is a flow diagram illustrating techniques according to another embodiment of the invention.

As an example, with reference to FIG. 7, a source-mask optimization flow may be modified based on the calibrated mask model. For example, at 702 an initial source shape is obtained, e.g., the shape of the illumination source that will be applied to the mask (e.g., an annular disk, or other illumination source shapes shape).

At 704, the initial lithography mask design may be obtained.

At 706, the calibrated mask model may be obtained and applied to the initial lithography mask design and fabrication process at 708 in a joint source mask optimization. For example, the calibrated mask model may include one or more corrections to the initial lithography mask design or fabrication process that may be used to optimize the mask. Apart from mask design optimization based on pattern fidelity, another aspect of this process is to also perform source optimization for the updated design pattern by tuning illumination conditions.

Figure 8:
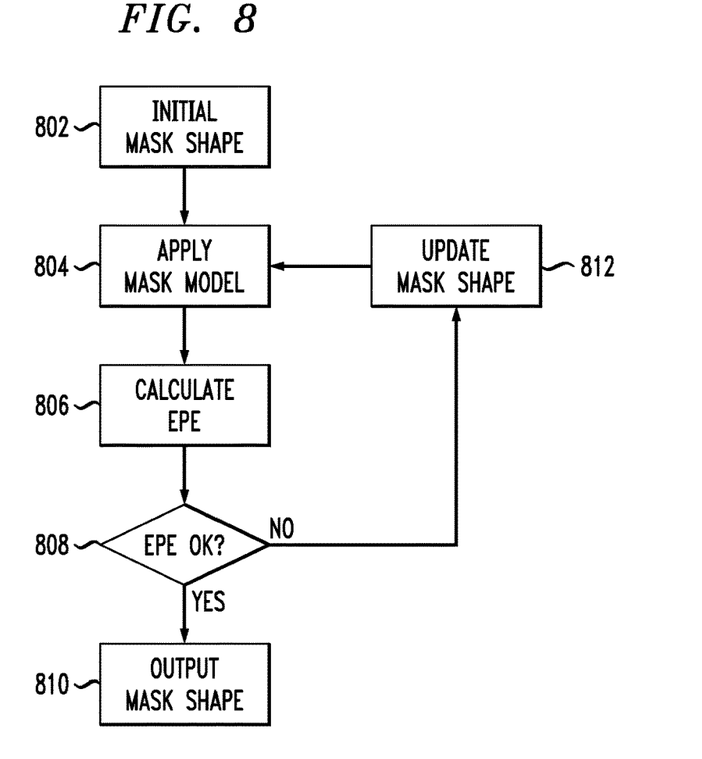
FIG. 8 is a flow diagram illustrating techniques according to another embodiment of the invention.

As another example, with reference to FIG. 8, an OPC flow may be modified based on the calibrated mask model. For example, at 802, an initial mask shape may be obtained and the calibrated mask model may be applied to the initial mask shape at 804, e.g., corrections in the calibrated mask model may be applied to modify the initial mask shape.

At 806, an edge placement error (EPE) for the modified mask shape may be calculated.

At 808, lithography mask fabrication logic 122 determines whether or not the calculated EPE is ok, e.g., below a predetermined threshold value. If the EPE is ok, the modified mask shape is output at 810. If the EPE is not ok, the modified mask shape is further updated by an iterative process that is bound by some mask design rules at 812. The goal of this process is to incrementally shift the design edges until a tolerable error limit is reached.

Figure 9A:
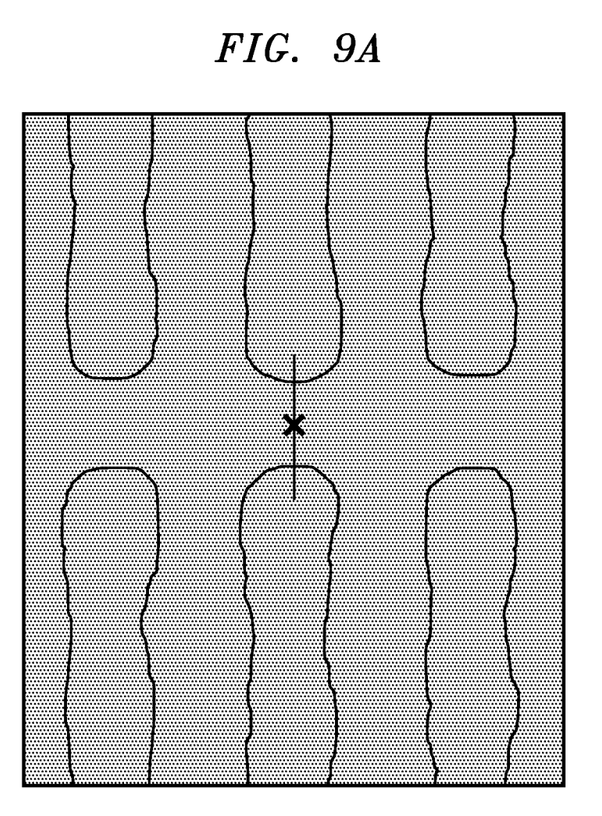
FIG. 9A is a diagram illustrating an extracted mask contour according to an embodiment of the invention.
Figure 9B:
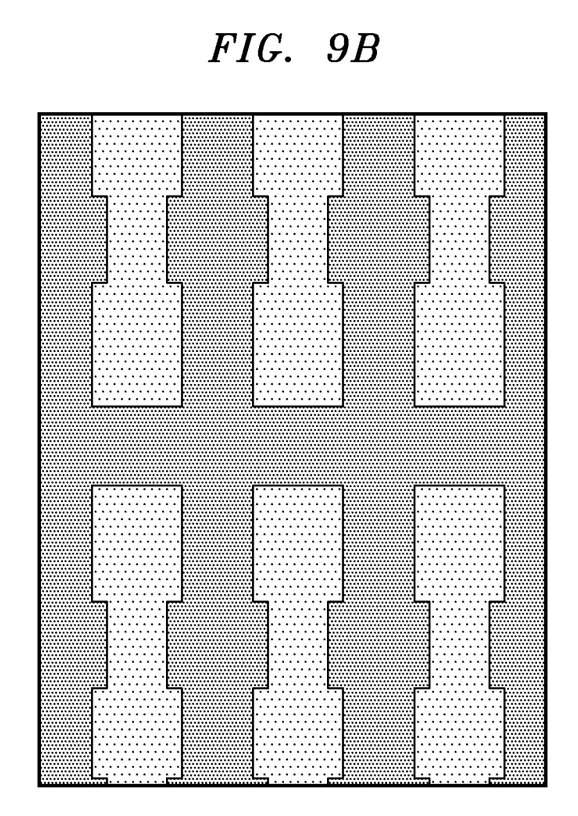
FIG. 9B is a diagram illustrating a mask design according to an embodiment of the invention.

In some embodiments, with reference now to FIGS. 9A and 9B, resist model calibration accuracy may be improved using the extracted mask contours (FIG. 9A) instead of ideal mask shapes (FIG. 9B). For example, typically a resist model is calibrated using an ideal mask shape, as illustrated in FIG. 9B, e.g., as defined by the obtained lithography mask design. In some embodiments, the actual contours of the fabricated mask, e.g., as illustrated in FIG. 9A, may be utilized to improve the calibration of the resist model. For example, a die-to-database mask inspection may be used as described above to inspect and sort the pattern images based on the threshold value, e.g., to identify those pattern image that have the most deviation from the initial lithography mask design. For a selected pattern image, mask contours may be extracted and scaled, e.g., from 4× to 1× or any other scaling depending on the mask or fabrication properties. The scaled mask contours may be imported into a lithography simulation tool that is configured to simulate mask contours. The simulated mask contours may then be used as possible wafer image shapes in a resist model calibration flow. The process is similar to using post-OPC design with an optical model to assess hotspots in the design that could cause yield limitations. In this case, we use the wafer image shapes generated by mask contours extracted from actual mask image rather than the post-OPC design itself to get a more accurate representation of wafer image.

In some embodiments, a gray scale threshold method may be used post image acquisition as a defect detection parameter. For example, equation (1) below may be used to detect a defect:

$$th = C \frac{\sqrt{I_{12} \times I_{23}}}{\sqrt{\sigma_{12} \times \sigma_{23}}} \quad (1)$$

Where:
σ is the noise level;
I is the gray level difference between the reference (mask design) and target (fabricated mask) images; and
C is a combination of weighted constants.

Figure 10:
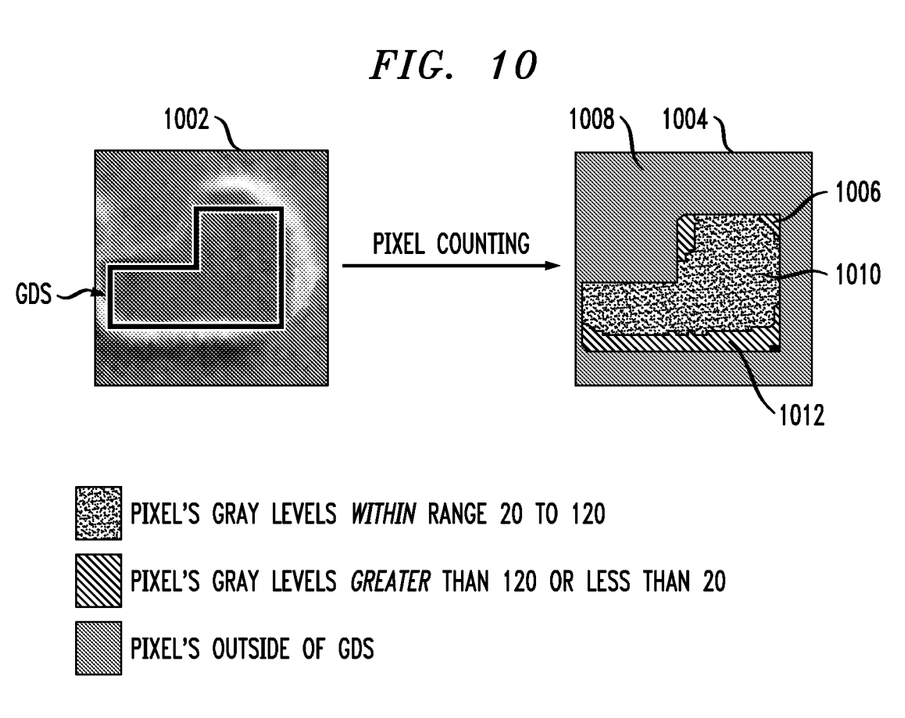
FIG. 10 is a diagram illustrated a pixel counting method according to an embodiment of the invention.

With reference now to FIG. 10, in some embodiments, a pixel counting method may also or alternatively be used post image acquisition as a defect detection parameter. For example, for each design pattern, e.g., represented by the graphic data system (GDS) region in an image 1002 of FIG. 10 of the fabricated lithography mask, a count of the number of the pixels inside the pattern that have gray levels within a certain range may be determined.

For example, as shown in FIG. 10, a representation 1004 of the output of the pixel counting tool is illustrated. Representation 1004 includes a pattern region 1006 corresponding to the GDS region of image 1002 and a region 1008 outside of the pattern region 1006. The pixel counting tool may count the number of pixels within the GDS region of image 1002 whose gray levels are between 20 to 120. These pixels may be represented within pattern region 1006 as a pattern or color 1010. For example, the GDS region of image 1002 represents the target pattern area, where pixels outside of the target pattern area may be assigned a particular gray level such as, e.g., a maximum or minimum gray level outside of the target pixel range, as represented by region 1008. The pixel counting tool may also count the number of pixels within the GDS region that meet a target criteria, e.g., between 20 and 120, represented by region 1010 or representation 1004, or are outside of the target criteria, e.g., greater than 120 or less than 20, represented by region 1012 of representation 1004. The output of the pixel counting tool may be used to determine a percentage or amount of deviation of the image 1002 from the target design pattern for that GDS region.

In some embodiments, the pixel counting may divide lines within the target pattern area into several small line segments and then count the number of the pixels with gray levels within the certain range, e.g., 20 to 120, inside each small segment to determine whether that segment contains a line defect. In some embodiments, this sub-module may be an alternative for detecting line defects such as line-broken and line-void.

In some embodiments, information or other data including the output of the electron beam inspection tool, the calibrated mask model, the lithography mask design, images of the fabricated lithography mask or any other data generated by lithography mask fabrication logic 122 may be stored on data repository 150. In some embodiments, a machine learning model may be trained on the information or other data stored in data repository 150 to identify patterns that are similar to those found to include abnormalities or be otherwise defective by the electron beam inspection tool. In some embodiments, the trained machine learning model may be configured to identify types of the patterns such that the calibrated mask model that was used to correct an abnormality in one pattern may be identified by the trained machine learning model as a potential solution for correcting an abnormality in another, similar, pattern. For example, the machine learning model may learn how certain types of patterns would be modified based on any mask process limitations. Because pattern fidelity inspections for are used for each design type, learning information on a give mask process may be help the machine learning model identify any outliers in the design phase i.e. before fabrication of the mask 210 or performing the mask N-1 inspection. For example, the fabrication of a lithography mask having a known or similar abnormality or defect to one previously identified during the mask N-1 or mask N inspections of another mask may be avoided, thereby reducing wasted time and other resources.

The techniques depicted in FIGS. 2-10 can also, as described herein, include providing a system, wherein the system includes distinct software modules, each of the distinct software modules being embodied on a tangible computer-readable recordable storage medium. All of the modules (or any subset thereof) can be on the same medium, or each can be on a different medium, for example. The modules can include any or all of the components shown in the figures and/or described herein. In an embodiment of the invention, the modules can run, for example, on a hardware processor. The method steps can then be carried out using the distinct software modules of the system, as described above, executing on a hardware processor. Further, a computer program product can include a tangible computer-readable recordable storage medium with code adapted to be executed to carry out at least one method step described herein, including the provision of the system with the distinct software modules.

Additionally, the techniques depicted in FIGS. 2-10 can be implemented via a computer program product that can include computer useable program code that is stored in a computer readable storage medium in a data processing system, and wherein the computer useable program code was downloaded over a network from a remote data processing system. Also, in an embodiment of the invention, the computer program product can include computer useable program code that is stored in a computer readable storage medium in a server data processing system, and wherein the computer useable program code is downloaded over a network to a remote data processing system for use in a computer readable storage medium with the remote system.

An embodiment of the invention or elements thereof can be implemented in the form of an apparatus including a memory and at least one processor that is coupled to the memory and configured to perform exemplary method steps.

The present invention may be a system, a method, and/or a computer program product at any possible technical detail level of integration. The computer program product may include a computer readable storage medium (or media) having computer readable program instructions thereon for causing a processor to carry out embodiments of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform embodiments of the present invention.

Embodiments of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general-purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

It should be noted that any of the methods described herein can include an additional step of providing a system comprising distinct software modules embodied on a computer readable storage medium; the modules can include, for example, any or all of the components detailed herein. The method steps can then be carried out using the distinct software modules and/or sub-modules of the system, as described above, executing on a hardware processor. Further, a computer program product can include a computer-readable storage medium with code adapted to be implemented to carry out at least one method step described herein, including the provision of the system with the distinct software modules.

In any case, it should be understood that the components illustrated herein may be implemented in various forms of hardware, software, or combinations thereof, for example, application specific integrated circuit(s) (ASICS), functional circuitry, an appropriately programmed digital computer with associated memory, and the like. Given the teachings of the invention provided herein, one of ordinary skill in the related art will be able to contemplate other implementations of the components of the invention.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of another feature, step, operation, element, component, and/or group thereof.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A computer-implemented method, the method comprising steps of:
    comparing a fabricated lithography mask to a lithography mask design, the fabricated lithography mask fabricated based at least in part on the lithography mask design using a mask fabrication process;
    identifying, based at least in part on the comparison of the fabricated lithography mask to the lithography mask design, an abnormality in a pattern of the fabricated lithography mask relative to a corresponding one of a plurality of patterns in the lithography mask design;
    generating a calibrated mask model based at least in part on the identified abnormality in the pattern of the fabricated lithography mask; and
    causing a modification of the mask fabrication process based at least in part on the calibrated mask model,
    wherein the steps are carried out by at least one computing device.

2. The computer-implemented method of claim 1, wherein the mask fabrication process comprises optical-proximity correction using an optical-proximity correction model, causing the modification of the mask fabrication process comprising causing a modification of the optical-proximity correction model based at least in part on the calibrated mask model.

3. The computer-implemented method of claim 1, wherein the optical-proximity correction model comprises at least one of segmentation, jogs, and tiling, wherein causing the modification of the optical-proximity correction model based at least in part on the calibrated mask model comprises causing a tuning of at least one of the segmentation, jogs, and tilting of the optical-proximity correction model based at least in part on the calibrated mask model.

4. The computer-implemented method of claim 1, wherein the mask fabrication process comprises a resist model, causing the modification of the mask fabrication process comprising causing a modification of the resist model based at least in part on the calibrated mask model.

5. The computer-implemented method of claim 4,
    wherein comparing the fabricated lithography mask to the lithography mask design comprises:
        extracting a contour of the pattern of the fabricated lithography mask;
        scaling the extracted contour based at least in part on a scaling performed in the fabrication process; and
        simulating a mask contour in a lithography simulation tool based on the scaled contour, and
    wherein causing the modification of the resist model comprises:
        causing a modification of the resist model based on the simulated mask contour.

6. The computer-implemented method of claim 1, wherein the mask fabrication process comprises a resolution enhancement technique, causing the modification of the mask fabrication process comprising causing a modification to the resolution enhancement technique based at least in part on the calibrated mask model.

7. The computer-implemented method of claim 1, wherein the calibrated mask model comprises an indication of at least one correction to be applied to the fabrication process for correcting the abnormality in the pattern of the fabricated lithography mask.

8. The computer-implemented method of claim 1,
wherein comparing the fabricated lithography mask to the lithography mask design comprises:
inspecting the fabricated lithography mask using an electron beam mask inspection tool, the electron beam mask inspection tool generating a macro-level variability matrix, each entry in the matrix corresponding to a given pattern in the fabricated lithography mask, each entry comprising a threshold value indicating a difference in the contours of the given pattern in the fabricated lithography mask relative to a corresponding pattern in the lithography mask design, and
wherein the identification of the abnormality in the pattern in the fabricated lithography mask is based at least in part on the threshold value corresponding to the pattern in the generated macro-level variability matrix.

9. The computer-implemented method of claim 1, further comprising:
storing information corresponding to the pattern and the calibrated mask model in a data repository;
training a machine learning model based at least in part on the stored information, the trained machine learning model configured to determine types of patterns in fabricated lithography masks; and
applying the trained machine learning model to at least one other mask fabrication process for fabricating at least one other lithographic mask based on at least one other lithographic mask design, the applied trained machine learning model configured to identify a correspondence between a type of a pattern in the fabricated at least one other lithographic mask and a type of the pattern in the fabricated lithographic mask and to apply the calibrated mask model to the at least one other mask fabrication process in response to the identification of the correspondence.

10. The computer-implemented method of claim 1, wherein comparing the fabricated lithography mask to the lithography mask design comprises counting the number of pixels in the pattern that have a grey level value between a first threshold value and a second threshold value.

11. The computer-implemented method of claim 10, wherein pattern is divided into a plurality of single line segments, the counting of the number of pixels in the pattern that have a grey level value between the first threshold value and the second threshold value comprising counting the number of pixels in the pattern single line segment by single line segment.

12. A computer program product comprising a computer readable storage medium having program instructions embodied therewith, the program instructions executable by a computing device to cause the computing device to:
compare a fabricated lithography mask to a lithography mask design, the fabricated lithography mask fabricated based at least in part on the lithography mask design using a mask fabrication process;
identify, based at least in part on the comparison of the fabricated lithography mask to the lithography mask design, an abnormality in a pattern of the fabricated lithography mask relative to a corresponding one of a plurality of patterns in the lithography mask design;
generate a calibrated mask model based at least in part on the identified abnormality in the pattern of the fabricated lithography mask; and
cause a modification of the mask fabrication process based at least in part on the calibrated mask model.

13. The computer program product of claim 12, wherein the mask fabrication process comprises optical-proximity correction using an optical-proximity correction model, causing the modification of the mask fabrication process comprising causing a modification of the optical-proximity correction model based at least in part on the calibrated mask model.

14. The computer program product of claim 12, wherein the optical-proximity correction model comprises at least one of segmentation, jogs, and tiling, wherein causing the modification of the optical-proximity correction model based at least in part on the calibrated mask model comprises causing a tuning of at least one of the segmentation, jogs, and tilting of the optical-proximity correction model based at least in part on the calibrated mask model.

15. The computer program product of claim 12, wherein the mask fabrication process comprises a resist model, causing the modification of the mask fabrication process comprising causing a modification of the resist model based at least in part on the calibrated mask model.

16. The computer program product of claim 15, wherein comparing the fabricated lithography mask to the lithography mask design comprises:
extracting a contour of the pattern of the fabricated lithography mask;
scaling the extracted contour based at least in part on a scaling performed in the fabrication process; and
simulating a mask contour in a lithography simulation tool based on the scaled contour, and
wherein causing the modification of the resist model comprises:
causing a modification of the resist model based on the simulated mask contour.

17. The computer program product of claim 12, wherein the mask fabrication process comprises a resolution enhancement technique, causing the modification of the mask fabrication process comprising causing a modification of the resolution enhancement technique based at least in part on the calibrated mask model.

18. The computer program product of claim 12, wherein the calibrated mask model comprises an indication of at least one correction to be applied to the fabrication process for correcting the abnormality in the pattern of the fabricated lithography mask.

19. The computer program product of claim 12,
wherein comparing the fabricated lithography mask to the lithography mask design comprises:
inspecting the fabricated lithography mask using an electron beam mask inspection tool, the electron beam mask inspection tool generating a macro-level variability matrix, each entry in the matrix corresponding to a given pattern in the fabricated lithography mask, each entry comprising a threshold value indicating a difference in the contours of the given pattern in the fabricated lithography mask relative to a corresponding pattern in the lithography mask design, and
wherein the identification of the abnormality in the pattern in the fabricated lithography mask is based at least in part on the threshold value corresponding to the pattern in the generated macro-level variability matrix.

20. A system comprising:
a memory; and
at least one processor operably coupled to the memory and configured for:
comparing the fabricated lithography mask to the lithography mask design, the fabricated lithography mask fabricated based at least in part on the lithography mask design using a mask fabrication process;

identifying, based at least in part on the comparison of the fabricated lithography mask to the lithography mask design, an abnormality in a pattern of the fabricated lithography mask relative to a corresponding one of a plurality of patterns in the lithography mask design;

generating a calibrated mask model based at least in part on the identified abnormality in the pattern of the fabricated lithography mask; and causing a modification of the mask fabrication process based at least in part on the calibrated mask model.

* * * * *